United States Patent
Ma et al.

(10) Patent No.: US 11,121,346 B2
(45) Date of Patent: Sep. 14, 2021

(54) OLED DEVICES HAVING IMPROVED EFFICIENCY

(71) Applicant: Universal Display Corporation, Ewing, NJ (US)

(72) Inventors: Ruiqing Ma, Morristown, NJ (US); Julia J. Brown, Yardley, PA (US); Chaoyu Xiang, Monmouth Junction, NJ (US); Michael Hack, Carmel, CA (US); Jason Paynter, Bristol, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/868,586

(22) Filed: May 7, 2020

(65) Prior Publication Data

US 2020/0266391 A1    Aug. 20, 2020

Related U.S. Application Data

(62) Division of application No. 15/173,109, filed on Jun. 3, 2016, now Pat. No. 10,686,159.

(60) Provisional application No. 62/185,263, filed on Jun. 26, 2015.

(51) Int. Cl.
  *H01L 51/52* (2006.01)
  *H01L 27/32* (2006.01)
(52) U.S. Cl.
  CPC ........ *H01L 51/5275* (2013.01); *H01L 27/322* (2013.01); *H01L 27/3211* (2013.01); *H01L 51/5268* (2013.01); *H01L 2251/558* (2013.01)

(58) Field of Classification Search
  CPC .......... H01L 51/52; H01L 27/32; H01L 51/56
  See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |

(Continued)

FOREIGN PATENT DOCUMENTS

| | | |
|---|---|---|
| CN | 1262893 C | 8/2000 |
| CN | 1444105 A | 9/2003 |

(Continued)

OTHER PUBLICATIONS

Baldo et al.Highly efficient phosphorescent emission from organic electroluminescent devices, Nature, vol. 395, pp. 151-154, 1998.

(Continued)

*Primary Examiner* — Sheng-Bai Zhu
(74) *Attorney, Agent, or Firm* — Butzel Long

(57) ABSTRACT

Devices, components and fabrication methods are provided for improving the efficiency of OLED displays. An outcoupling component such as a microlens array (MLA) is attached to an OLED, with a relatively small distance between the MLA and the OLED. Cross-talk and back scattering are reduced by the use of colored lenses, focusing layers, and other methods.

10 Claims, 17 Drawing Sheets

(56) References Cited

U.S. PATENT DOCUMENTS

| | | |
|---|---|---|
| 6,091,195 A | 7/2000 | Forrest |
| 6,097,147 A | 8/2000 | Baldo |
| 6,280,559 B1 | 8/2001 | Terada |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,984,934 B2 | 1/2006 | Moller |
| 7,038,373 B2 | 5/2006 | Arnold |
| 7,279,704 B2 | 10/2007 | Walters |
| 7,431,968 B1 | 10/2008 | Shtein |
| 7,714,500 B2 | 5/2010 | Hirakata |
| 7,968,146 B2 | 6/2011 | Wagner |
| 8,125,138 B2 | 2/2012 | Luttgens |
| 8,159,426 B2 | 4/2012 | Chang |
| 8,400,018 B2 | 3/2013 | Joannopoulos |
| 8,502,445 B2 | 8/2013 | Levermore |
| 8,827,488 B2 | 9/2014 | Weaver |
| 8,896,200 B2 | 11/2014 | Huang |
| 9,231,227 B2 | 1/2016 | Weaver |
| 2002/0027300 A1* | 3/2002 | Hartmann ............. G03F 7/0002 264/1.1 |
| 2003/0178936 A1 | 9/2003 | Park |
| 2003/0230980 A1 | 12/2003 | Forrest |
| 2004/0021762 A1 | 2/2004 | Seki |
| 2004/0061107 A1 | 4/2004 | Duggal |
| 2004/0174116 A1 | 9/2004 | Lu |
| 2006/0091412 A1* | 5/2006 | Wheatley ................ H01L 33/44 257/98 |
| 2006/0139758 A1 | 6/2006 | Segawa |
| 2006/0214093 A1 | 9/2006 | Nakajima |
| 2007/0069635 A1 | 3/2007 | Cok |
| 2007/0205423 A1 | 9/2007 | Yamazaki |
| 2007/0279372 A1 | 12/2007 | Brown |
| 2008/0048200 A1 | 2/2008 | Mueller |
| 2008/0142814 A1 | 6/2008 | Chu |
| 2008/0198180 A1 | 8/2008 | Langendijk |
| 2009/0092325 A1 | 4/2009 | Brown |
| 2009/0295283 A1 | 12/2009 | Kim |
| 2010/0045576 A1 | 2/2010 | Park |
| 2010/0090620 A1 | 4/2010 | Hack |
| 2010/0103187 A1 | 4/2010 | Linssen |
| 2010/0187988 A1 | 7/2010 | Forrest |
| 2010/0201256 A1 | 8/2010 | Xue |
| 2010/0219427 A1 | 9/2010 | Fukuda |
| 2010/0231484 A1 | 9/2010 | Cok |
| 2010/0244069 A1 | 9/2010 | Weaver |
| 2011/0062427 A1 | 3/2011 | Jeong |
| 2011/0095276 A1 | 4/2011 | Imai |
| 2011/0096530 A1 | 4/2011 | Shimizu |
| 2011/0248294 A1 | 10/2011 | Weaver |
| 2011/0309389 A1 | 12/2011 | Yu |
| 2012/0075278 A1 | 3/2012 | Hara |
| 2012/0104430 A1 | 5/2012 | Kim |
| 2012/0287605 A1 | 11/2012 | Chen |
| 2013/0002690 A1* | 1/2013 | Ichinose ............. H01L 51/5275 345/522 |
| 2013/0082589 A1 | 4/2013 | So |
| 2013/0105833 A1 | 5/2013 | Weaver |
| 2013/0187132 A1 | 7/2013 | Ando |
| 2013/0285537 A1 | 10/2013 | Chaji |
| 2014/0065750 A1 | 3/2014 | Harikrishna |
| 2014/0084256 A1 | 3/2014 | Kim |
| 2014/0203244 A1 | 7/2014 | Hack |
| 2014/0209888 A1 | 7/2014 | Hack |
| 2014/0300972 A1* | 10/2014 | Sasaki ................. G02B 3/0031 359/642 |
| 2014/0327709 A1 | 11/2014 | Hack |
| 2015/0171374 A1 | 6/2015 | Burrows |
| 2015/0340410 A1 | 11/2015 | Hack |
| 2015/0349034 A1 | 12/2015 | Hack |
| 2016/0380238 A1 | 12/2016 | Ma |

FOREIGN PATENT DOCUMENTS

| | | |
|---|---|---|
| CN | 1837974 A | 9/2006 |
| CN | 102856349 A | 1/2013 |
| JP | 2002216947 A | 8/2002 |
| JP | 2005310749 | 11/2005 |
| JP | 2007273275 | 10/2007 |
| JP | 2011060720 | 3/2011 |
| JP | 2011060722 | 3/2011 |
| JP | 2013016273 | 1/2013 |
| JP | 2013058447 | 3/2013 |
| JP | 2013114772 A | 6/2013 |
| JP | 2013149536 | 8/2013 |
| JP | 2013542464 | 11/2013 |
| TW | 201250999 A | 12/2012 |
| WO | 2008057394 A1 | 5/2008 |
| WO | 2010011390 A2 | 1/2010 |
| WO | 2014020817 A1 | 2/2014 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Hack, et al., "Novel Two Mask AMOLED Display Architecture", SID 2014 Digest, pp. 567-569.

International Search Report and Written Opinion dated Nov. 10, 2015 in corresponding International Application No. PCT/US2015/032672, dated Nov. 10, 2015.

Kim, et al., "Highly enhanced light extraction from organic light emitting diodes with little image blurring and good color stability", Organic Electronics 17, 2015, 115-120.

Nikolov, et al., "Samsung Galaxy S6 review—a bunch of innovations in a beautiful body", Laptopmedia.com, available at http://laptopmedia.com/reviews/samsung-galaxy-s6-review-a-bunch-of-innovations-in-a-beautiful-body, Mar. 25, 2015.

Office Action dated Mar. 8, 2018 for U.S. Appl. No. 15/173,109 (pp. 1-20).

Wood, "MacAdam Ellipses", Protocol, 2010, 15-18.

Chinese Office Action issued in corresponding CN Patent Application No. 201610479150.4, dated Sep. 13, 2018, 7 pages.

Chinese Office Action for Application No. CN201610479150.4, dated Sep. 26, 2019, 6 pages.

Japanese Office Action (with English language translation) for Application No. JP2016-119493, dated Jan. 7, 2020, 15 pages.

Chinese Office Action for Application No. CN105120037, dated Jan. 7, 2020, 13 pages.

Chinese Office Action (with English language translation) for Application No. CN201610479150.4, dated Feb. 3, 2020, 17 pages.

Japanese Office Action (with English translation) for App. No. JP2020-074193, dated Mar. 9, 2021, 7 pages.

* cited by examiner

Cone: H:R=1:1

Cone: H:R=2:1

Flat top cone: H:R:r=1:1:0.5

OLED emissive region

Lens with flat top

OLED DEVICES HAVING IMPROVED EFFICIENCY

CROSS-REFERENCE TO RELATED APPLICATIONS

This application is a divisional application and claims the priority benefit of U.S. patent application Ser. No. 15/173,109, filed Jun. 3, 2016, and U.S. Provisional Patent Application Ser. No. 62/185,263, filed Jun. 26, 2015, the entire contents of which are incorporated herein by reference in their entirety.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to arrangements and techniques for improving the efficiency of OLED-based displays using outcoupling components disposed close to the OLEDs, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

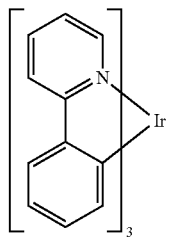

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an organic light emitting display is provided that includes a first emissive region having a width across a substrate of 2r and an outcoupling component disposed over the emissive region and having a horizontal base surface, where the base surface is disposed a vertical distance t from the first emissive region and optically coupled to the first emissive region, and the outcoupling component has an index of refraction $n_{lens}$ and a width across the base surface of 2R, with $0 < t < \sqrt{n_{lens}^2 - 1}*(r+R)$. The distance d from a side edge of the first emissive region to a projection of an edge of the outcoupling component onto the substrate may be greater than or equal to $(n_{lens}-1)r$. For a width 2r, r may be less than 20 μm or less. A spacing layer may be disposed between the first emissive region and the outcoupling component, which layer may include a material having an index of refraction within 0.02 of $n_{lens}$. The distance t may be relatively small, such as 80 μm or less, 27 μm or less, 15 μm or less. The width 2R may be greater than the width 2r. The outcoupling component may include an array of outcoupling components having a total radius R, with each being disposed at least partially over the emissive region, in which case d is a distance from an edge of the emissive region to a projection of an edge of an outermost outcoupling component of the outcoupling component array. A light absorption material may be placed on an edge of the outcoupling component disposed closest to the emissive region. A defocusing layer may be placed between the outcoupling component and the emissive region. The defocusing layer may have an index of refraction $n_{def}$ that is less than $n_{lens}$. The index $n_{def}$ may be less than $$n_{lens} \operatorname{Sin}\left(\operatorname{arcTan}\left(\frac{d}{t}\right)\right).$$

The outcoupling component may include other components or features, such as a color agent. Such a color agent may be selected to have the same color as a peak wavelength of light emitted by the emissive region. A circular polarizer may be disposed between the outcoupling component and the emissive region. The outcoupling component may have an approximately circular base, or any other suitable shape. It may have a maximum thickness that is at least 10% greater than r. It may have a variety of structural shapes, such as having a decreasing cross-sectional area along a line normal to the emissive region, and in a direction moving away from the emissive region. For example, the outcoupling component may be a microlens or pyramid, a flat top microlens or pyramid, or the like.

The total active area of the display may be not more than 50% of the total area of the display. The display may include any number of pixels, each of which may include multiple subpixels. The emissive region may emit light to be emitted by one of the plurality of subpixels. The display may include at least one outcoupling component for each of the plurality of subpixels. The display may include subpixels of multiple colors, but may include outcoupling components for subpixels of only a particular color of the plurality of colors. The outcoupling components may include a dye that matches the particular color. Each emissive region in the display may be individually addressable.

In an embodiment, an organic light emitting display is provided that includes a first emissive region having a width across a substrate of 2r, a scattering layer disposed over the emissive region and having a width of 2R, and a spacing layer with a thickness t and an average refractive index of $n_{sp}$ that is disposed between and optically coupled to the first emissive region and the scattering layer, for which $0 < t < \sqrt{n_{sp}^2 - 1}*(r+R)$. The scattering layer may be a ring or any other suitable shape on the substrate. The general structure, composition, and arrangement of the display otherwise may be similar or identical to the other display arrangements disclosed herein.

In an embodiment, a method of fabricating an organic light emitting display is provided that includes obtaining a plurality of OLEDs, fabricating an outcoupling component array, and optically coupling the outcoupling component array to the plurality of OLEDs where, for each OLED and at least one outcoupling component disposed in a stack with, and optically coupled to the OLED, $0 < t < \sqrt{n_{lens}^2 - 1}*(r+R)$, where 2r is the width of the each OLED, t is the vertical distance from an emissive layer of the OLED to the at least one outcoupling component, $n_{lens}$ is the index of refraction of the at least one outcoupling component, and R is the total radius of the at least one outcoupling component. The method also may include attaching the outcoupling component array to the plurality of OLEDs. Fabricating the outcoupling component array may include fabricating the outcoupling component over the plurality of OLEDs and/or depositing the outcoupling component array via an ink-jet technique. The display resulting from the provided methods may have any of the display structures, compositions, and arrangements disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
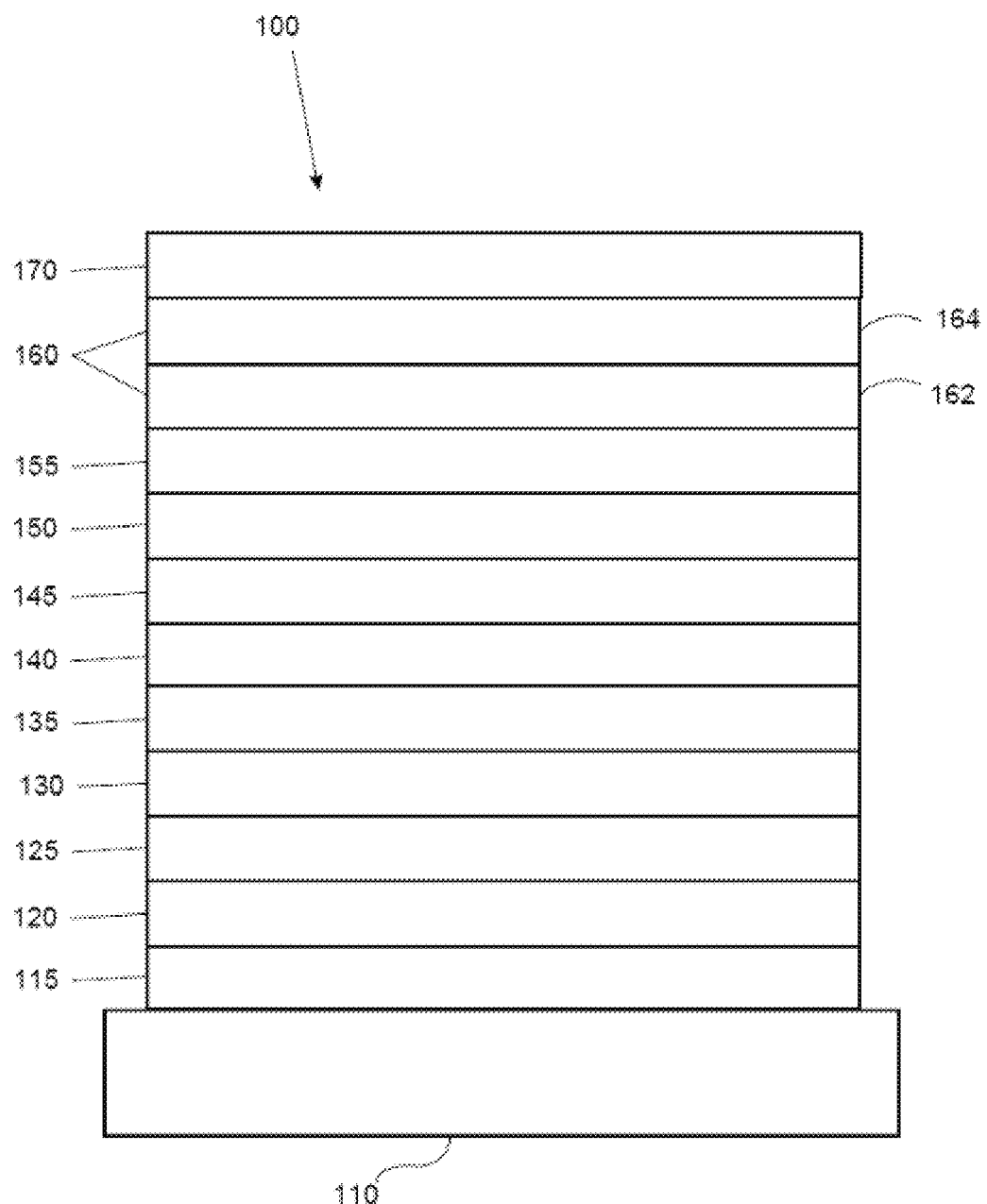
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
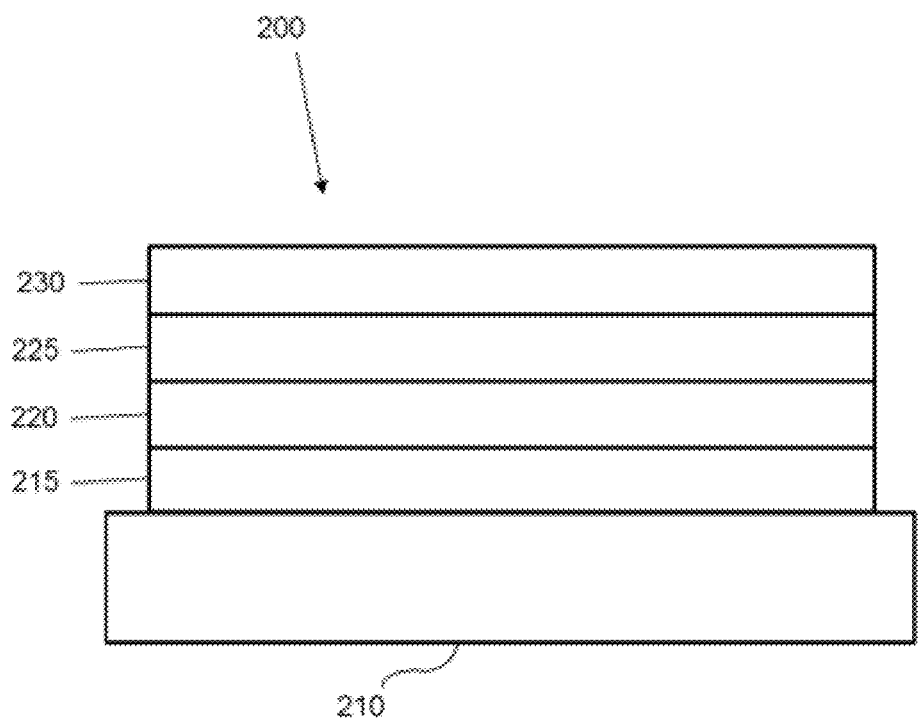
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US 2007/023098 and PCT/US 2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

It is well known that not all the light generated in OLEDs can escape into the air. This is mainly due to the total internal reflection effect: when light reaches an interface from a high index medium ($n_h$) to a low index medium ($n_l$), the light will be totally reflected when the incident angle is larger than the critical angle defined as $$\theta_c = \arcsin\left(\frac{n_l}{n_h}\right) \quad (1)$$

For example, out of all the light generated in an EML layer which has an index of ~1.8, only about 20~25% can reach the air. Over the years, two primary techniques have been developed to extract trapped light into the air: one uses a scattering effect and the other uses microlens array (MLA). Both approaches typically are only used in OLED lighting devices, not displays such as full-color displays. The techniques generally are not suitable to displays due to optical cross talk during on-state, and/or to back scattering, which reduces the contrast.

Optical cross talk in a display refers to a phenomena in which the light intended to be emitted by one pixel or sub-pixel is also emitted from one or more neighboring pixels or sub-pixels. This will compromise the pixel definition and result in the loss of display resolution. The use of a scattering film generally is especially problematic in this regard—when light emitted from one pixel encounters a scattering medium, it may propagate randomly, thereby resulting a much larger profile then the original pixel size.

Back scattering arises from the fact that both a scattering film and an MLA film re-direct light in the backward direction. As used herein, "back scattering" is used in a general sense to refer to any light that is re-directed backward. Unlike the specular reflection from smooth surfaces, back scattered light from an MLA or a scattering film generally has a random distribution and is hard to eliminate. As a result, to apply light extraction techniques to displays, it is desirable to address the optical cross talk and low contrast due to back scattering.

MLAs typically represent a more desirable approach to control cross talk and back-scattering because the light emitting profile is better controlled. For example, U.S. Pat. No. 6,984,934, the disclosure of which is incorporated by reference in its entirety, discloses a microlens arrangement for a light emitting diode in which the maximum planar dimension of the microlens are smaller than the smallest minimum planar dimension of any of the OLEDs. As another example, U.S. Pat. No. 8,125,138 discloses a spaced OLED arranged within acceptance angles of the microlens to generate collimated light. However, neither approach fully addresses the challenges of optical cross talk and low contrast due to back scattering. Jung-Bum Kim et. al describes building a microlens array on top of a top-emission OLED device using a Vacuum Thermal Evaporation (VTE) method (Organic Electronics 17 (2015) 115-120). However, such a technique is limited to top-emission OLEDs, and the associated method to fabricate the MLA is not scalable and the quality of the MLA by VTE method is very limited.

In contrast, devices, components and fabrication methods for improving the efficiency of OLED displays are disclosed herein, in which a microlens array may be attached to OLED displays with a relatively small distance between the MLA and the OLED(s). Cross-talk and back scattering issues also may resolved be by colored lenses, a focusing layer, and other methods as disclosed herein.

Specifically, embodiments disclosed herein provide an organic light emitting display that includes a first organic emissive region, such as an emissive region within a sub-pixel of a pixel of the display, which has a width across a substrate of 2r. In general r may be any suitable size. However, in some embodiments such as where the emissive region corresponds to an individual subpixel, r may be about 20 µm or less. An outcoupling component, such as a lens of a microlens array, may be disposed over the emissive region, where the outcoupling component has a horizontal base surface that is disposed a vertical distance t from the first emissive region, and which is optically coupled to the emissive region. The arrangement fulfils the condition that $0<t<\sqrt{n_{lens}^2-1}*(r+R)$, where the outcoupling component has an index of refraction $n_{lens}$ and a width across the base surface of 2R. In some embodiments it may be preferred for the emissive region to be relatively small compared to the outcoupling component, for example, for the width 2R of the outcoupling component to be greater than the width 2r of the OLED. Similarly, in some embodiments the active area of a display, i.e., the area of the display that includes emissive regions within the area, may be 50% or less of the total area of the display. In some embodiments it may be preferred that the outcoupling component is disposed directly on top of the emission region with the centers of the base dimension positioned on the same line drawn perpendicularly to the emission region.

The arrangements and techniques disclosed herein with respect to individual OLEDs may be applied to subpixels within a full color display. For example, a typical display arrangement includes multiple pixels, each of which includes one or more subpixels. As a specific example, a full-color pixel of a display often will include at least red, green, and blue subpixels. Thus, in some embodiments, the emissive regions and OLEDs as disclosed herein may be the components of the subpixels in a full-color display that generate the light for each subpixel. By definition, in a typical display arrangement each subpixel is individually addressable or otherwise controllable by the display, to allow each pixel of the display to emit any desired color of light.

Figure 3:
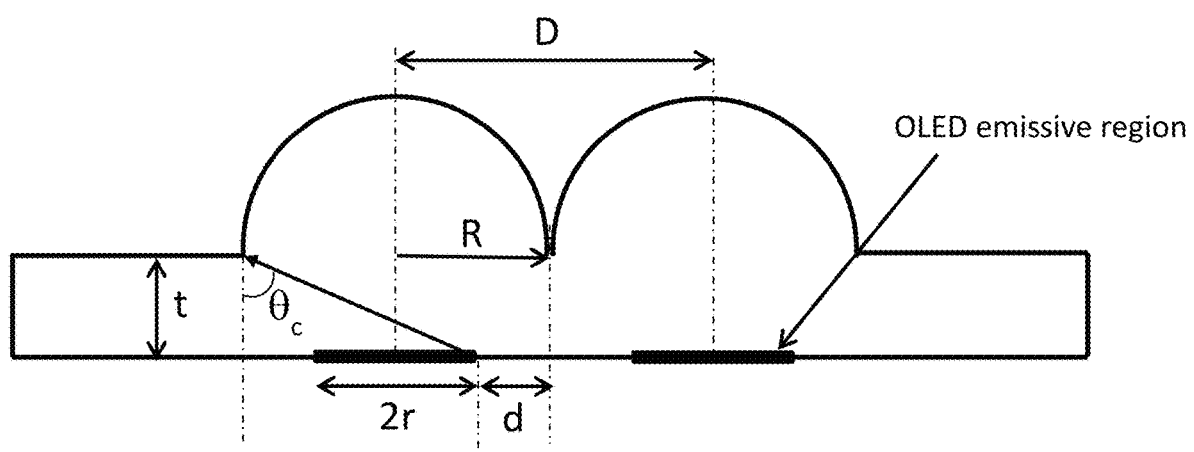
FIG. 3 shows an example pixel configuration according to an embodiment of the invention, in which each sub-pixel has a corresponding lens.

FIG. 3 shows a configuration in which each pixel has a corresponding lens in a microlens array. To realize the light extraction benefit, the following condition is met:

$$\arctan\left(\frac{r+R}{t}\right) > \theta_c = \arcsin\left(\frac{1}{n_{lens}}\right) \quad (2)$$

where t is the distance between the light emitting layer and the base of the MLA. After simplification, equation 2 becomes $$t<\sqrt{n_{lens}^2-1}*(r+R)=\sqrt{n_{lens}^2-1}*(2r+d) \quad (3)$$

where r and R are half of the pixel size and the radius of the microlens, and R=r+d, as shown in FIG. 3. In this equation, n, r, and d are dictated by the display resolution and substrate materials. Based on the display configuration, the maximum t requirement can be calculated for a desired light extraction benefit. For a display with a red/green/blue (RGB) strip configuration, this can be further simplified to:

$$t < \sqrt{n_{lens}^2-1}\,\frac{8000}{Re}\,\mu m \quad (4)$$

where Re is the resolution of the display with a unit of pixel per inch.

Figure 4:
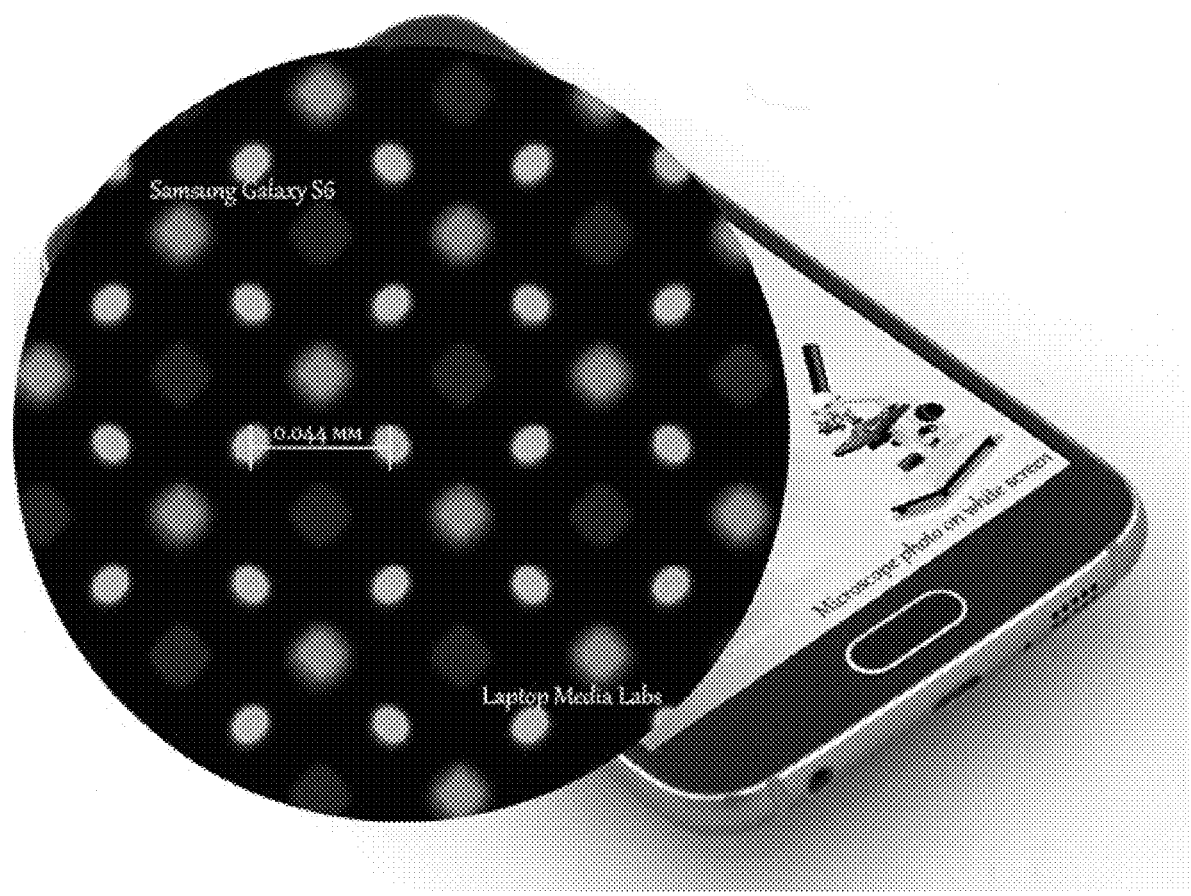
FIG. 4 shows an example pixel layout suitable for use with embodiments of the present invention.

FIG. 4 shows a pixel layout of the Samsung Galaxy S6 phone, as provided by laptopmedia.com/reviews/samsung-galaxy-s6-review-a-bunch-of-innovations-in-a-beautiful-body. Based on the picture, it is estimated that the pixel dimensions are approximately 13.5 μm for the red subpixel, 11.3-13.5 μm for the green subpixel, and 15.8 μm for the blue subpixel. The spacing between the blue and adjacent green pixel edges, which is equivalent to 2d, is about 18 μm. This results in approximate values of r=7.9 μm, and =9 μm. Using equation 3, to have a light extraction effect due to a microlens (n=1.5) covering each subpixel, t should be less than 27.7 μm. As another example, a 50" 4k TV has a resolution of about 100 ppi, which roughly corresponds to a (2r+d) value of ~80 μm. When glass substrate is used, this gives the condition of t<89 μm.

As shown in equation 3, the parameters t, r, and d are all related. Generally speaking, r is pre-determined. It is preferred that t be relatively thin, for example, as thin as allowed by the fabrication process, and that d should be as large as possible and use all the space available between neighboring pixels. US Patent Publication No. 2015/0171374, the disclosure of which is incorporated by reference in its entirety, provides a guideline for designing d as $$d \geq (n-1)r \quad (5)$$

where n is the refractive index of the lens. This equation is derived assuming t=0. Thus, in some embodiments having an outcoupling component with an index of refraction $n_{lens}$, it may be preferred for the distance d from the side of the emissive region to a projection of an edge of the outcoupling component onto the substrate to be at least $(n_{lens}-1)*r$. This may apply in configurations disclosed herein that do not use a single outcoupling component per emissive region or subpixel, with d referring to the corresponding measurement between an edge of the emissive region and a projection of an outermost edge of an outcoupling component, outcoupling component array, scattering layer, or other functionally similar structure, as shown in FIGS. 3, 10, 11, 12, and 18.

To demonstrate these properties, a simulation was conducted based on the approximate dimension of the red subpixel in a Samsung Galaxy S6, using r=6.75 μm and d=8.75 μm as shown in FIG. 4, using a hemispherical microlens array with one microlens as an outcoupling component associated with each subpixel. The radius (R=r−d) is 15.5 μm. The lenses are close packed and the material of the lenses have index of refraction of n=1.52 and no absorption. A Lambertian emission pattern was applied to the pixel. The space between the pixel and the microlens was filled with same index material (n=1.52) and the enhancement was simulated depending on the space distance (t). The curve in FIG. 5 with closed square symbols shows the distance (t) dependence of enhancement. For a single hemisphere lens, light extraction efficiency increases with the decrease of distance t as shown. There is no enhancement if the distance is larger than 27 μm. This threshold matches the calculation from equation (4). As the distance is decreased, more light can be extracted. For example, a 126% enhancement is achieved for a distance of 5 μm. FIG. 6 shows the angular emission profiles of this configuration with different t values.

Figure 7:
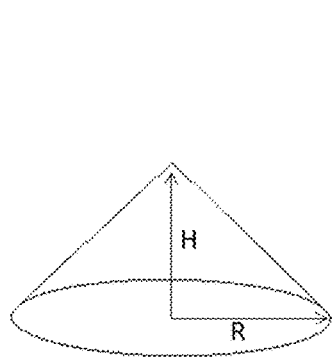
FIG. 7 shows examples of cone shaped lenses suitable for use with embodiments of the invention.
Figure 7:
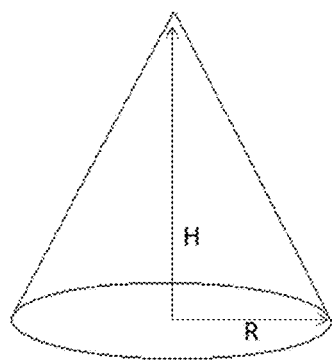
Figure 7:
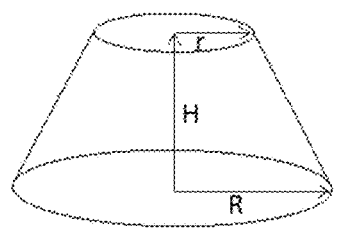
Figure 8:
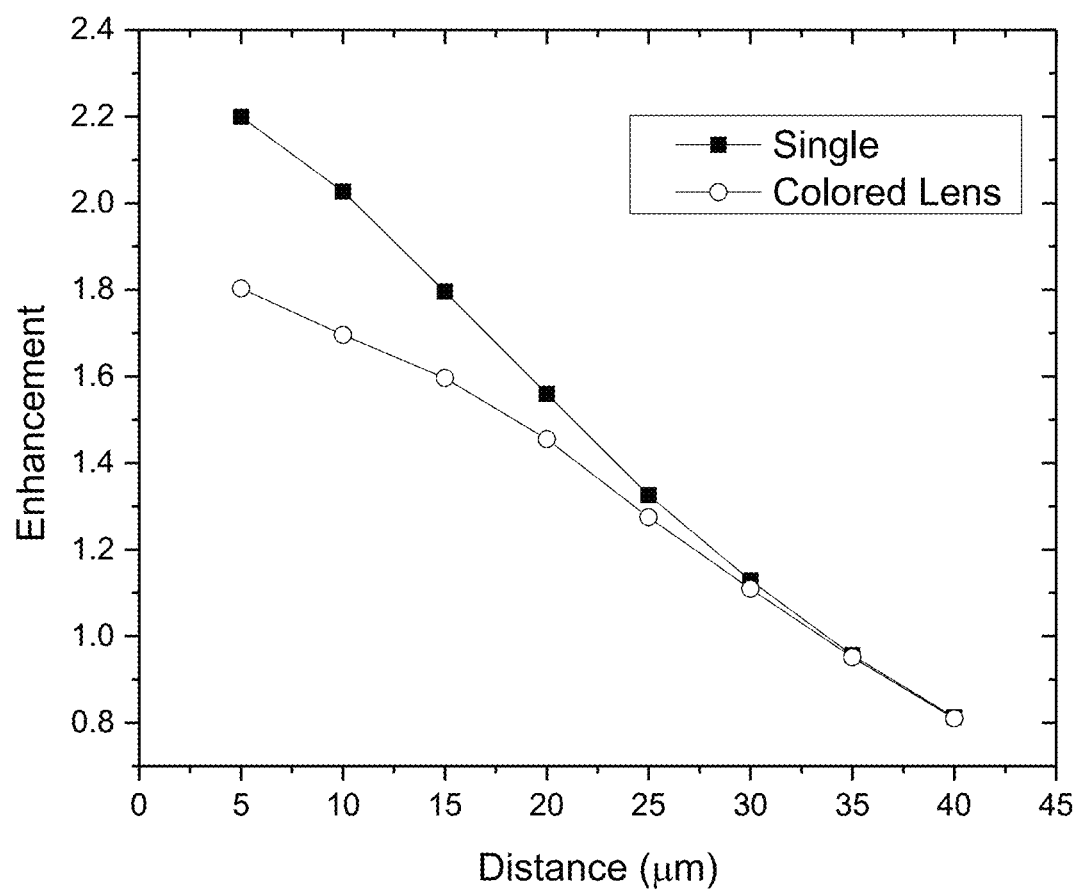
FIG. 8 shows the distance (t) dependence of enhancement for cone shaped lenses according to embodiments of the invention.
Figure 20:
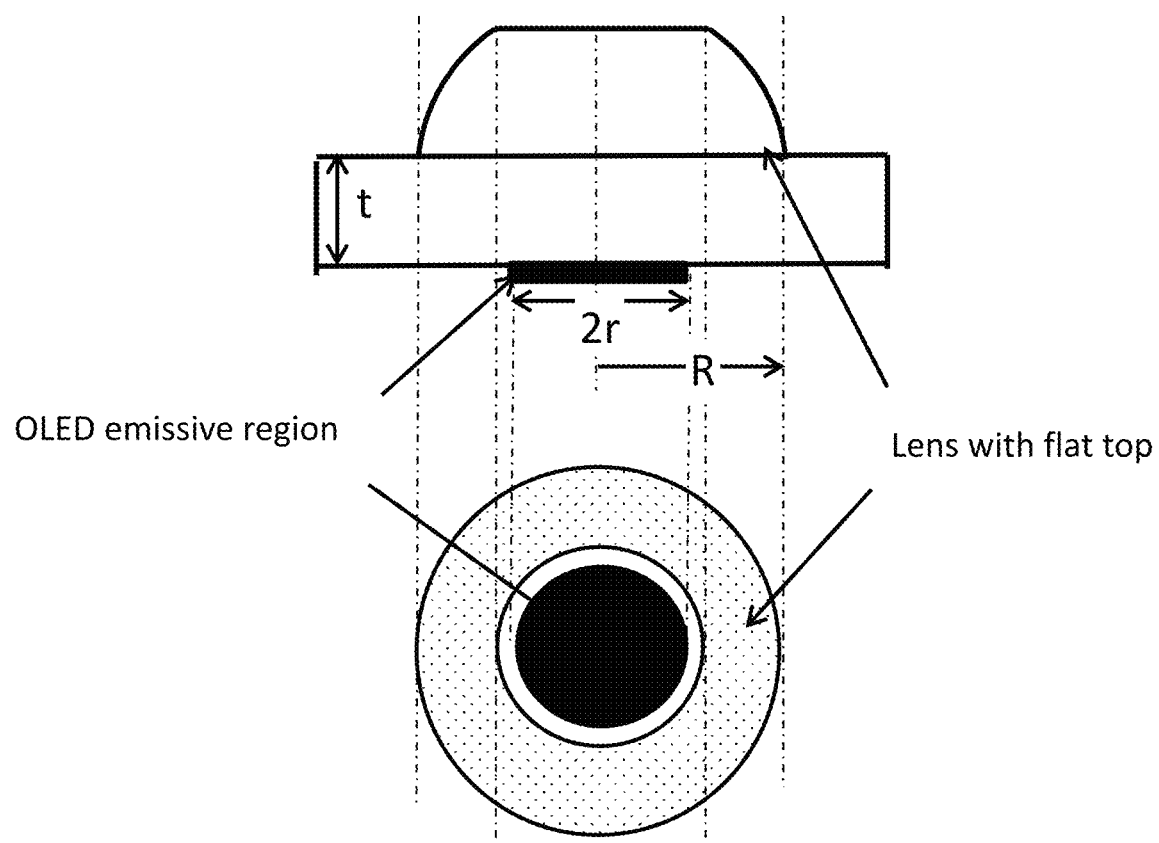
FIG. 20 shows an outcoupling structure using a hemispherical lens with flat top surface according to an embodiment of the invention.

Other types of outcoupling components also may be used with arrangements disclosed herein. For example, cone shaped lenses may be used as the outcoupling components for subpixels, as shown in FIG. 7. The results of cone shaped lenses are readily applicable to other similar features such as prisms. The curve with closed square symbols in FIG. 8 shows the distance dependence of the enhancement. For a single cone, the light extraction efficiency increases with the decrease of distance. The threshold of the cone is 34 μm, which is larger than the hemispherical lens. As the distance decreases, more light may be extracted. For example, 120% enhancement may be achieved at a distance of 5 μm. When the distance is larger than the threshold, the emitted light has a strong forward emission, resulting in little or no significant different in extraction enhancement as shown in FIG. 8. More generally, in some embodiments it may be preferred to use outcoupling components such as microlenses that are similar to a hemisphere, but not entirely hemispherical in shape, to further improve outcoupling from the emissive region. For example, flat top cones as shown in FIG. 7 or "flattened" hemispherical outcoupling components as shown in FIG. 20 may be used. In some embodiments, it may be preferred for the outcoupling component to have a decreasing cross-sectional area along a line normal to the emissive region, and in a direction moving away from the emissive region. The flat top cone in FIG. 7 and the flattened hemisphere in FIG. 20 are specific examples of such a geometry, though other shapes may be used.

In some embodiments, a spacing layer may be disposed between the emissive region and the outcoupling component. For example, referring again to FIG. 3, the distance t may include a spacing layer disposed above the OLED emissive region and the base of the microlens associated with the emissive region. In some cases, the spacing layer may be a physically integral portion of the outcoupling component, such as where a microlens sheet is used to provide multiple outcoupling components for multiple subpixels, and the lens portion of the microlens sheet is disposed over a layer of the same material. In other cases, the spacing layer may include the same or similar material as the outcoupling component. It may be preferred for the spacing layer to be optically similar to the outcoupling component. Specifically, it may be preferred for the spacing layer to have the same, or similar index of refraction to the outcoupling component, such as within 0.02 of the index of the outcoupling component.

Figure 5:
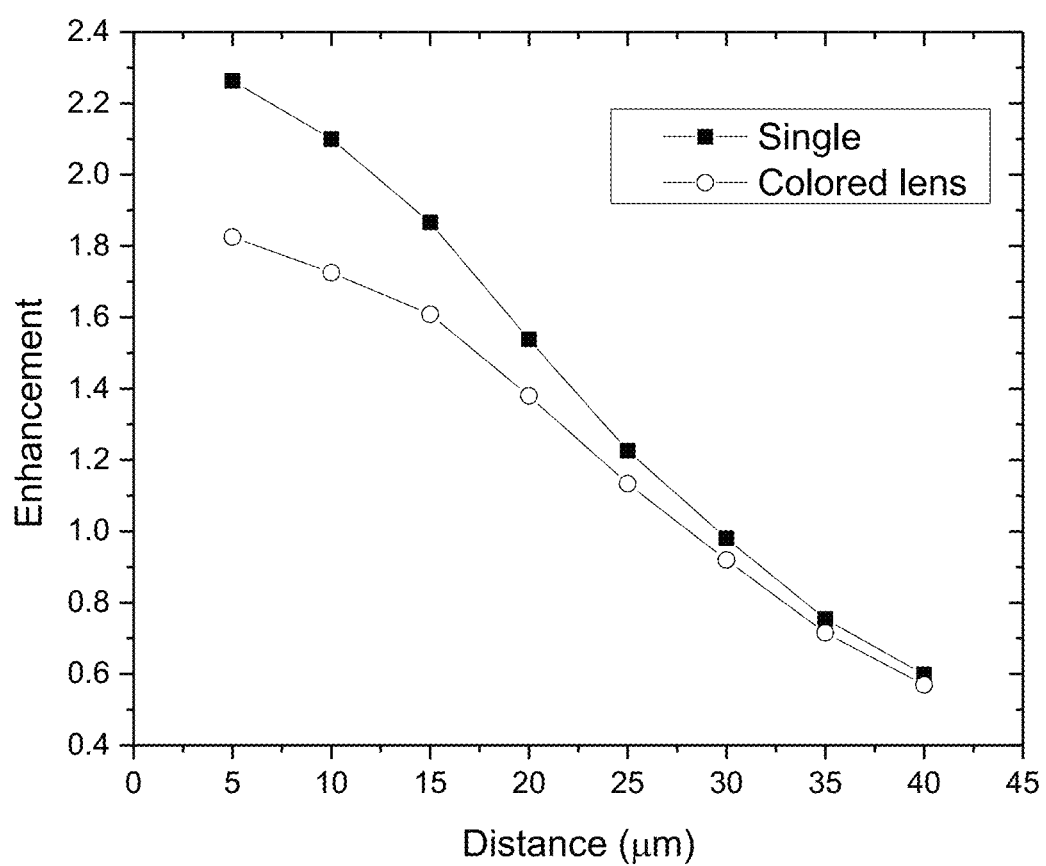
FIG. 5 shows the distance (t) dependence of enhancement for the hemispherical lenses according to an embodiment of the invention.
Figure 6:
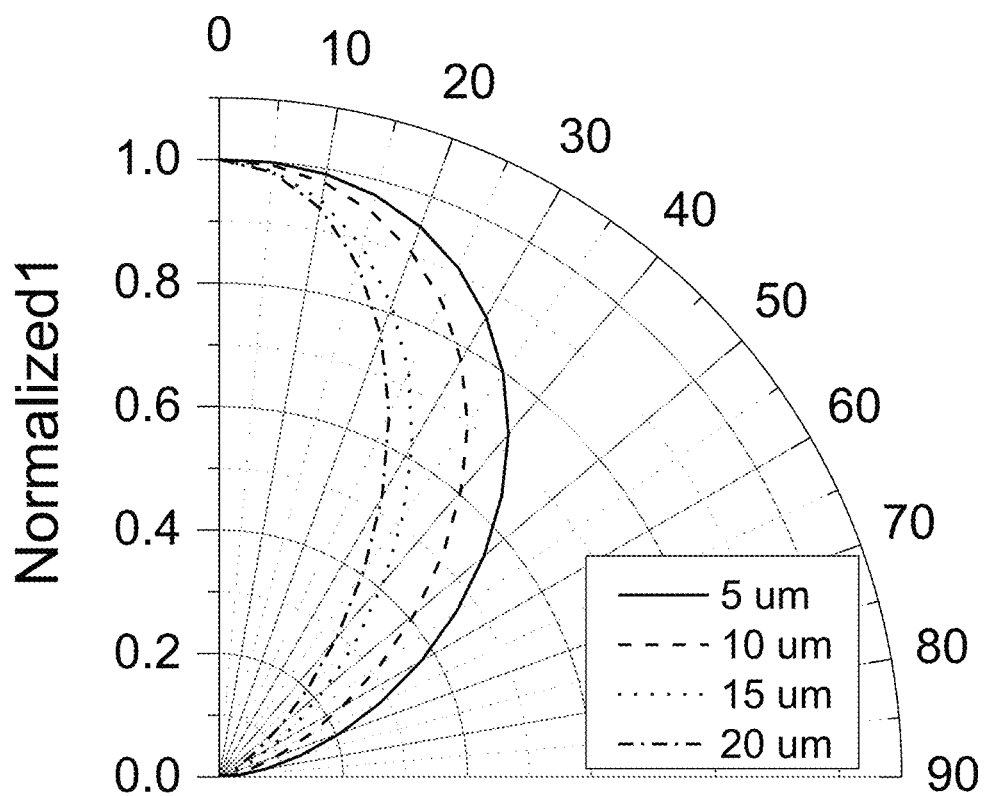
FIG. 6 shows the angular emission profiles of the configuration shown in FIG. 5 for different t values according to embodiments of the invention.
Figure 9:
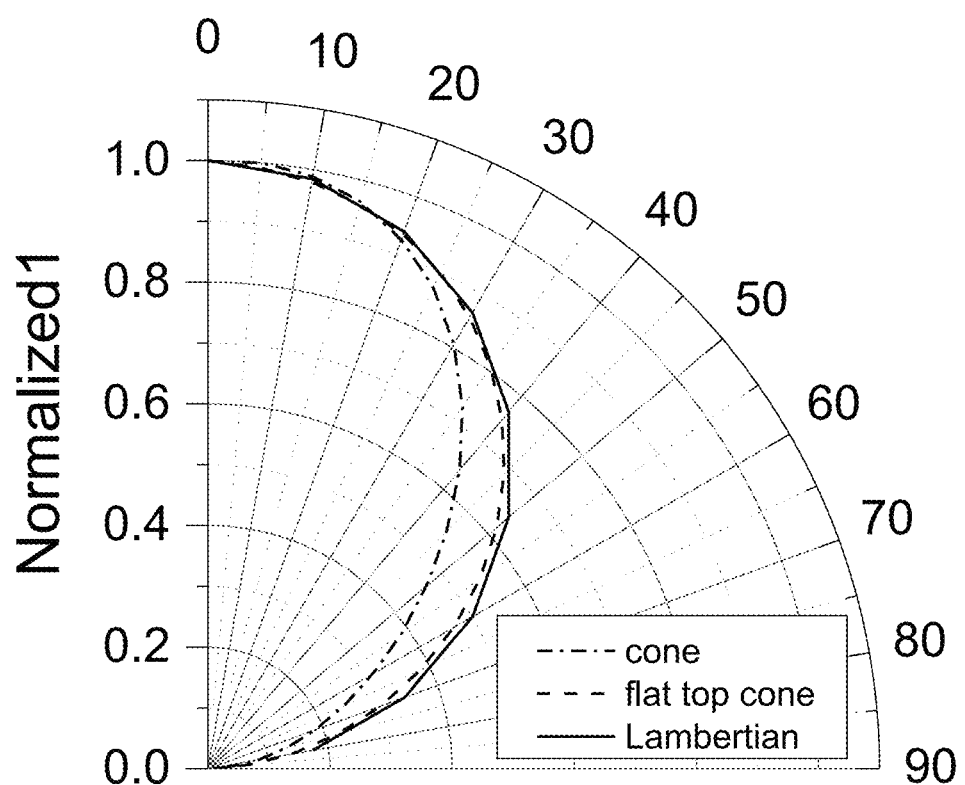
FIG. 9 shows the angular emission profiles of cone shaped lenses according to embodiments of the invention.

A benefit of using micro features such as a microlens array or similar component is the tunability of angular dependence of emitting light, as shown in FIGS. 5 and 9. The angular dependence may be tuned by using different sizes and types of features in the outcoupling component. For example, the large angle emission is greater for smaller t values when using hemispherical microlenses. When cone shaped lenses are used, a large off-Lambertian emission pattern results, as shown by the dotted line in FIG. 9. As another example, if a flat-topped cone is used, as shown by the short dashed line in FIG. 9, a close Lambertian emission profile is achieved. This example assumes a cone with a base of radius of 15.5 μm, a top with radius of 10 μm, a height of 15.5 μm. The distance is 10 μm for all cones in these examples.

Notably, the distance t encompasses any and all layers between the EML and the horizontal base of the outcoupling component, such as the base of a microlens array. Because the thickness of layers such as transparent electrodes, organic emissive layers, and the like typically are relatively very thin, t may be very accurately approximated as the distance between the surface of the OLED electrode and the base of the outcoupling component. Thus, as used herein in relation to t or otherwise in relation to distances measured relative to an OLED or an emissive layer or region of an OLED, the terms "OLED" and "emissive region" may be used interchangeably. Similarly, for clarity the drawings presented herein may show an OLED, which one of skill in the art will readily understand as including one or more emissive regions, without showing the internal structure of the OLED as shown in FIGS. 1 and 2.

In a configuration in which a microlens array is laminated to an OLED built on glass, t includes at least the thicknesses of glass substrate, the MLA base film, and the lamination glue. In a configuration in which an OLED is disposed directly on the back of an MLA film, t includes the thickness of MLA base film, the planarization layer (if present), the barrier layer (if present), and any other functional layers between the OLED and MLA film. In both example configurations, it may be difficult to achieve a t of less than 89 μm, and it may be difficult or impossible to achieve a t of less than 27.7 μm absent the techniques disclosed herein. However, in many configurations, a t of much less than those example values may be desirable in order to get enough light extraction benefit. Embodiments disclosed herein allow for relatively very small t values, such as 80 μm, 27 μm, 15 μm, or less.

Figure 10:
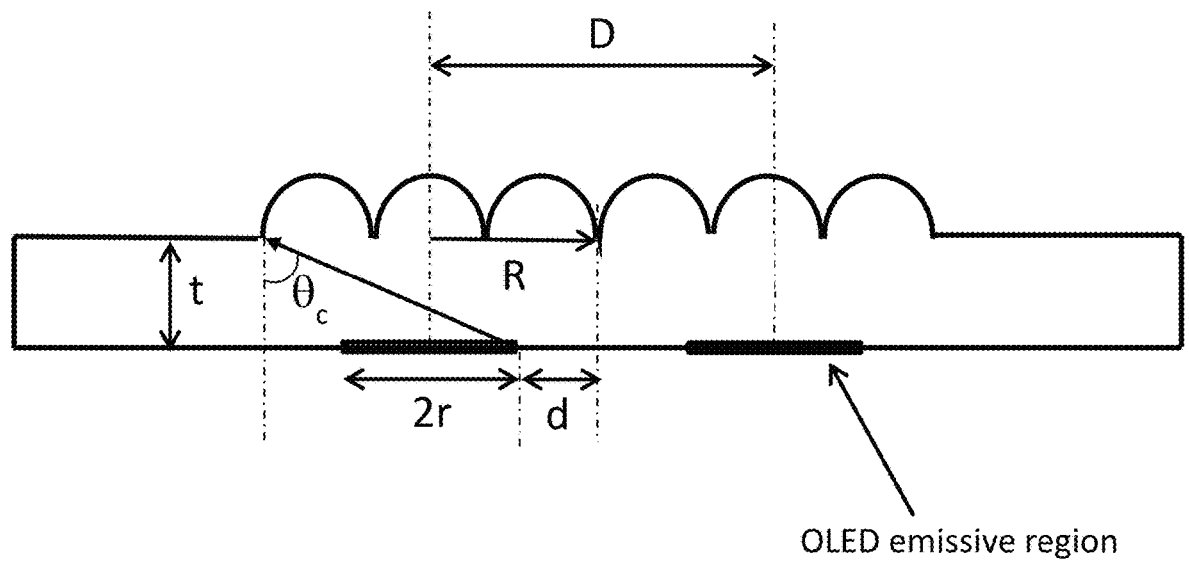
FIG. 10 shows a configuration in which multiple lenses correspond to one pixel according to an embodiment of the invention.

The example configurations described above include one microlens corresponding to each subpixel. In some embodiments, multiple outcoupling components such as multiple microlenses from a microlens array may correspond to one subpixel, as shown in FIG. 10. It is also possible to have one lens in one direction and multiple lenses for the other dimension. For example, the outcoupling component may be an outcoupling component array that includes multiple features having a total radius R as shown in FIG. 10. For example, the outcoupling component array may be all or a portion of a microlens array, multiple pyramidal, rectangular, hemispherical, or flattened hemispherical lenses as previously described, or any other combination of outcoupling components features. The outcoupling component array may be disposed at least partially over the emissive region, and/or each component in the array associated with a particular emissive region may be disposed at least partially over the emissive region. In such a configuration, d refers to the distance from an edge of the emissive region to a projection of an edge of the outermost outcoupling component of the outcoupling component array.

Figure 11:
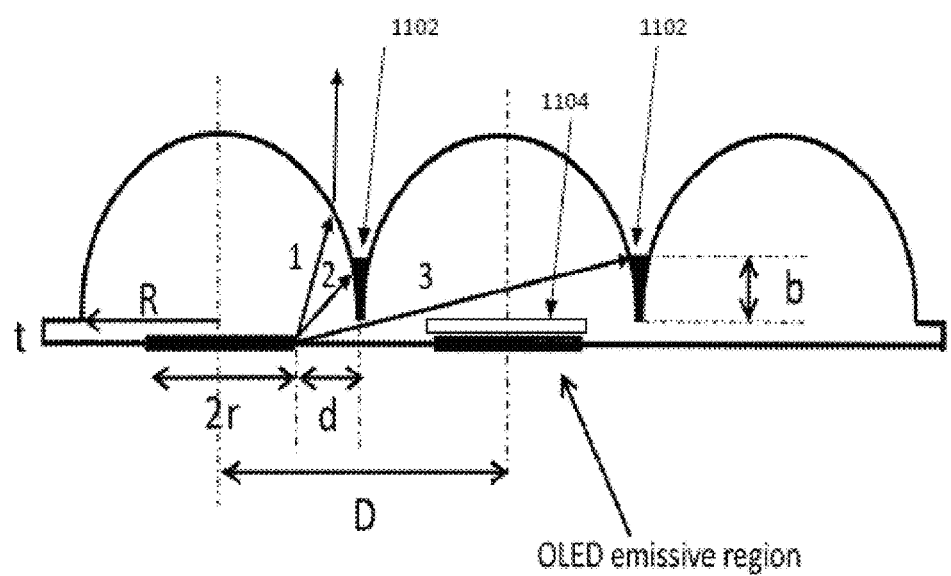
FIG. 11 shows a schematic illustration resulting in cross talk and a corrective black matrix according to an embodiment of the invention.

Because t typically will not be 0, not all the light emitted by the emissive region can be collected by the micro-lens. This is illustrated in FIG. 11. Light ray 1 emits into the air through the lens. However, light ray 3 enters the neighboring lens and would emit from the neighboring lens, thereby causing undesirable cross talk.

To address this potential cross talk, the base of the outcoupling component (i.e., the surface of the outcoupling component disposed closest to the emissive region) may be coated with a light absorption material such as a black dye to absorb the stray light rays. The dye may prevent cross talk due to stray light, with minimum impact on the otherwise outcoupled light. Light ray 3 represents a worst case scenario, in which a light ray will reach the furthest away from lens base plane (defined as b). Using the small angle approximation:

$$b = \frac{t}{d} * 2R \quad (5)$$

For example, to prevent b from being greater than 0.2R, t should be less than 0.1 d. In the example Galaxy S6 device in which d=9 μm, t thus will be less than 0.9 μm. The black dye may be applied so as to absorb only the light that would enter the neighboring outcoupling component. One potential drawback to such an approach may be that the enhancement is compromised due to absorption of light by the dye.

Such a structure may be fabricated by dispensing black dye solution to the base of the outcoupling component, such as on a microlens array on the lens side. After curing, the black dye will stay at the bottom section of the lenses. The height of the resulting black matrix is determined by the amount of the solution dispensed.

Figure 12:
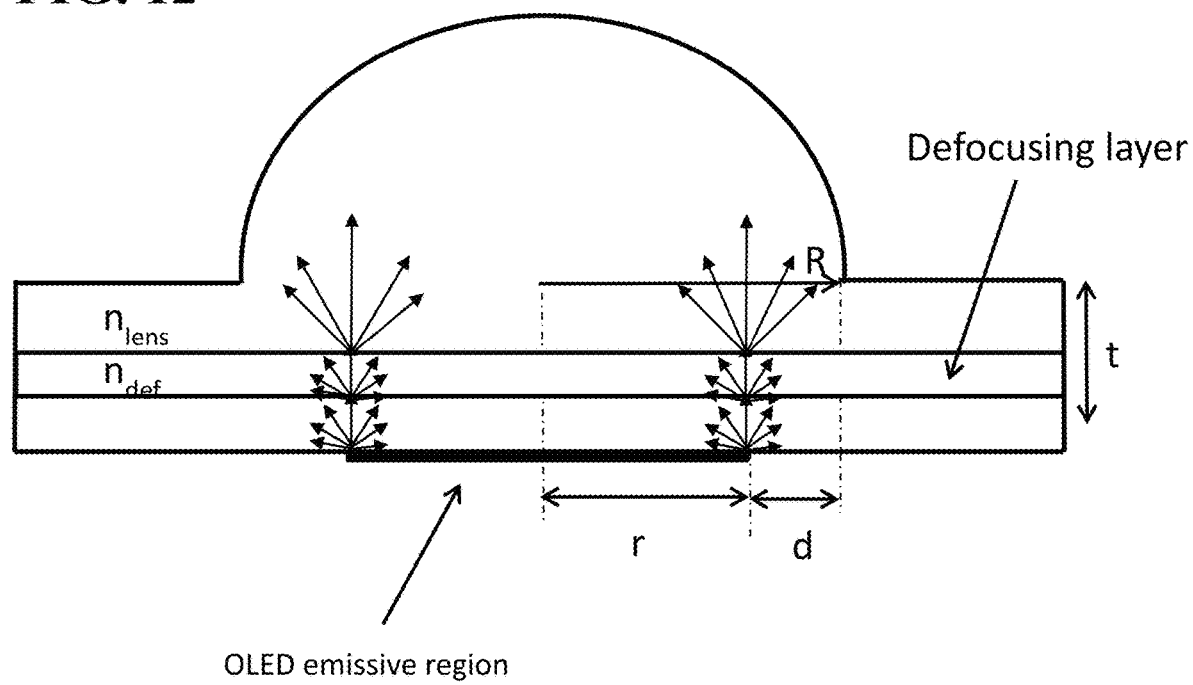
FIG. 12 shows an illustration of the working principle of a defocusing layer according to an embodiment of the invention.

Another technique that may reduce or prevent optical crosstalk according to embodiments disclosed herein is the use of a defocusing layer inserted between the base of the outcoupling component and the EML, where the refractive index of the defocusing layer is smaller than that of the outcoupling component base material. Because this layer has a smaller index, the light entering into the lens material will have a much narrower profile based on Snell's law. The net effect is that the light is more focused entering the lens base, as shown in FIG. 12. In such a configuration the stray light is confined between the defocusing layer and the EML layer. Preferably the light in the outcoupling component base is focused enough to be fully, or substantially entirely collected by the outcoupling component. Assuming the defocusing layer is very close to the EML layer and the lens configuration is as defined in FIG. 12, the index of the defocusing layer $n_{def}$ should meet the following condition:

$$n_{def} < n_{lens} \mathrm{Sin}\left(\mathrm{arcTan}\left(\frac{d}{t}\right)\right) \quad (6)$$

Again using the example Samsung Galaxy S6 device having d=8.75 μm, and assuming t=5 μm and $n_{lens}$=1.7, $n_{def}$ is less than 1.47. Thus, if an $SiO_2$ layer is used as the defocusing layer and the outcoupling component is a material with a refractive index of 1.7, cross talk in the display pixels and subpixels is reduced or prevented. It may be preferred for the thickness of to defocusing layer to be at least comparable to the wavelength of the light emitted by the associated emissive region, but less than t valued defined by equations 3 & 4.

Another novel way to eliminate/reduce cross talk according to embodiments disclosed herein is to integrate a "color agent" with the outcoupling component. In general, each outcoupling component, such as each lens in a microlens array, may include one or more color agents. The color agent may be any material that has the property of selectively transmitting or emitting light with a desired color, such as a desired wavelength range as disclosed herein. Some examples of color agents are dyes, color conversion materials, quantum dots, and the like. For example, materials currently used as color filters in LCDs and color conversion materials in LED backlights may be used. Typically the color agents will be red, green and blue, but embodiments disclosed herein are not limited to those colors.

In a display architecture in which individual red, green and blue subpixels are used, the colored lenses (with color agents) may be arranged such that the color of each lens is the same as the color of the OLED pixel, e.g. red lens for red pixel. This way, when red light enters the neighboring pixel lens, it will be absorbed by the green or blue dyes in the neighboring pixels. It has little/no loss going through the lens with the same color. This is also an effective way to improve contrast.

In a display architecture in which color filters are placed on top of white OLED subpixels, the colored outcoupling component may directly replace the color filter with the same color and/or position. For example, a red lens may replace a red color filter, a yellow lens a yellow color filter, and the like, with no color lens or a clear lens being disposed on top of the white device that is intended to emit white light.

A simulation was performed to estimate the light extraction efficiency of the colored lens approach. Two scenarios were considered. First, rays were coupled to the next lens by waveguide (e.g., ray 3 in FIG. 11). The property of these rays will depend on the distance—the thinner the distance between the OLED and the outcoupling component, the less chance of coupling. Cross talk also may happen to the large angle emitting rays out of one outcoupling component when they hit the surface of the adjacent component (e.g., ray 2 in FIG. 11). Thus, considering both types of cross talk and assuming 100% absorption from neighboring colored lens, a new enhancement plot is generated in FIG. 5. In this case, the light extracting efficiency is lower. When the distance is larger than the threshold, emitting light has a strong forward emission. Thus there is no significant different in extraction enhancement. After the threshold, large angle emission will be absorbed by the next pixel lens resulting in lower enhancement. However, 82% enhancement can still be achieved if the distance reduces to 5 µm. The same plot is also generated for the case of cone lenses, as shown as the curve with open circles in FIG. 8.

One advantage of OLED displays compared to other types of displays is the extremely high contrast ratio available. In some embodiments, this may be achieved by placing a circular polarizer in front of the display. This approach is particularly effective when all interfaces are planar. When outcoupling components such as microlenses are used, this approach may no longer be effective because light rays may change directions after entering and then exiting the microlenses. Another issue is that outcoupling components such as MLAs may be good ambient light collectors, thus causing strong back-scattering leading to lower contrast.

The solutions for this issue can be addressed by one or more of several approaches. First, the same principle for colored lens to reduce cross talk also works for reducing back scattering. Those back scattered light rays tend to travel through multiple lenses, and colored lenses can effectively absorb the light through this process. Notably, the colored lens itself may be good enough for contrast ratio performance such that no circular polarizer is needed. This may double the outcoupling performance of an MLA or similar outcoupling component alone—for example, the 82% enhancement in FIG. 5 becomes 164%.

As another approach, the use of a black dye as previously disclosed also may reduce the scattering of outcoupling components such as MLAs. Black dye can be applied at the lens base or inside the OLED in the non-emissive areas.

In some embodiments, a circular polarizer still may be used. For example, it may be placed between the outcoupling component and the OLED. As previously disclosed, the thickness of this structure preferably follows equations 3 and 4. In some embodiments, the circular polarizer may be placed on top of the outcoupling components. In this case, the thickness of the circular polarizer is not limited by equations 3 and 4.

When the top surface of the outcoupling component is flat, a circular polarizer may be disposed on top of the outcoupling component, including any micro-features of the component. It may be preferred that the size of the top flat area is larger than the size of the active area of the emissive regions. This results in a minimum disruption of the polarization of the light and the viewer can see a clear image. For example, FIG. 20 shows an example of a hemispherical lens with a flat top surface. With a circular polarizer placed on top, such a structure may provide good outcoupling and contrast. Alternatively or in addition, an anti-reflection (AR) coating may be disposed on top of the outcoupling component surface to reduce interfacial reflection.

Figure 16:
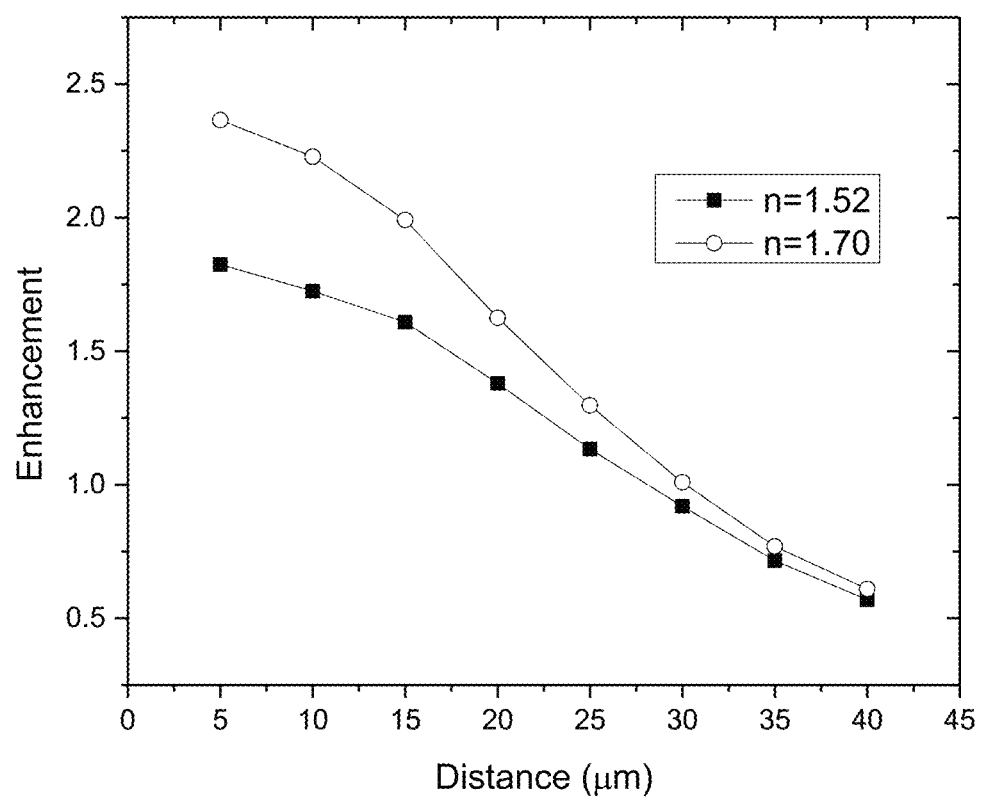
FIG. 16 shows simulation results of the impact of the refractive index of the MLA according to an embodiment of the invention.

The index of the outcoupling component including its base also may affect the optical properties of embodiments disclosed herein. A simulation was conducted using hemispherical lens to compare the outcoupling efficiency of the MLA with different refractive index of 1.52 and 1.7. The configuration of colored lens was used with 100% absorption of different color. The result is show in FIG. 16. With a higher index material, more light can be extracted. At a distance of 5 µm distance, 137% enhancement was achieved for the higher 1.7 index. In comparison, 82% enhancement was achieved for the lower 1.52 index.

Various techniques may be used to fabricate devices as disclosed herein. Two examples will now be described for an RGB colored pixel and for each display subpixel corresponding to one microlens. Other configuration can be fabricated using similar processes, including different types and arrangements of emissive regions, subpixels, and/or outcoupling components.

Figure 13:
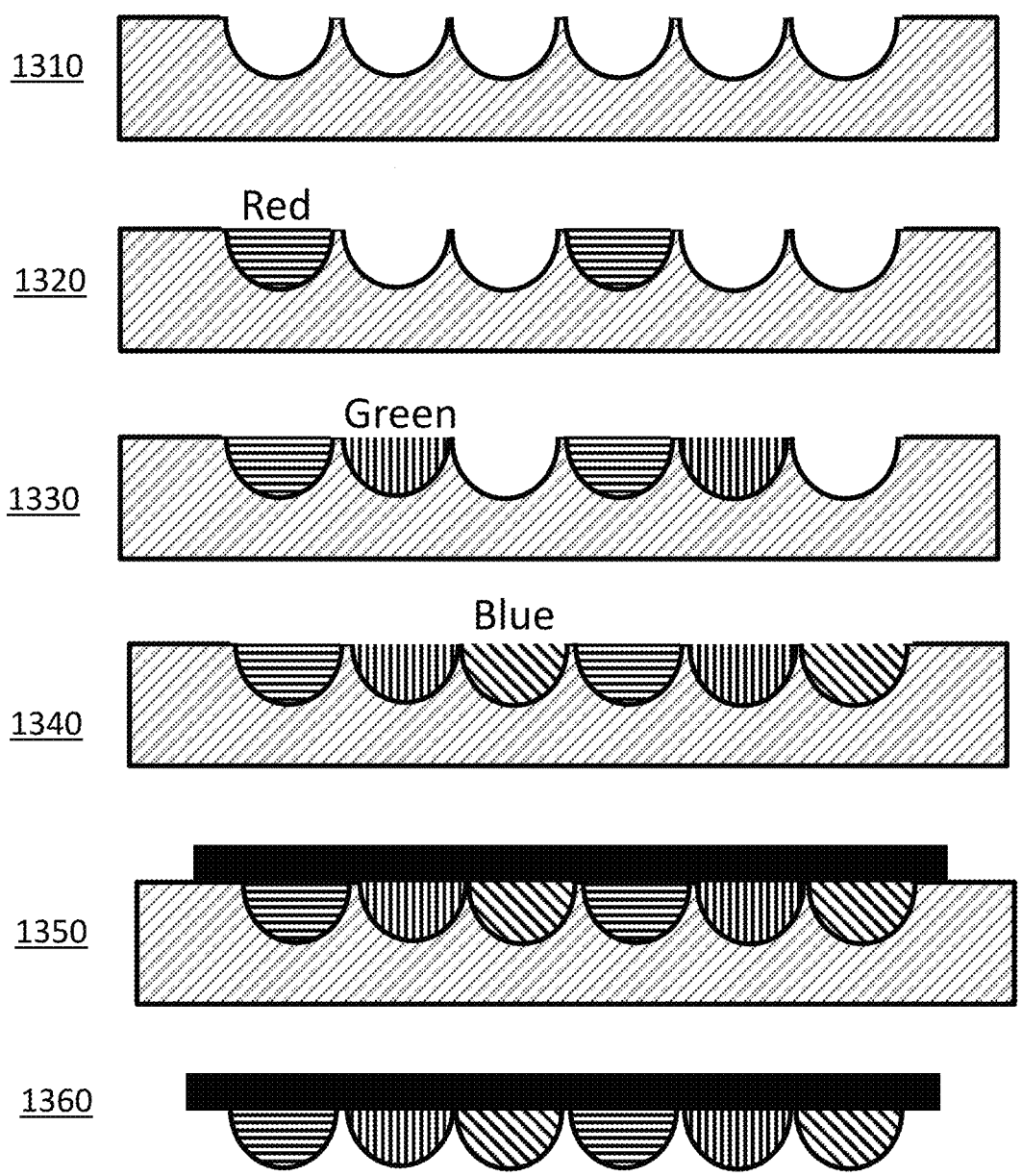
FIG. 13 shows an example process to fabricate colored lenses according to an embodiment of the invention.

FIG. 13 shows an example technique to fabricate an MLA with colored lenses. At 1310 a mold is made or obtained with a desired layout for microlens placement corresponding to the display pixel layout, e.g., with one or more microlenses corresponding to emissive regions of subpixels as previously disclosed. The shape of the well can be hemisphere, cones, prisms or other shapes.

Figure 14:
FIG. 14 shows a schematic representation of colored lens coating filling only a portion of each well on a mold according to an embodiment of the invention.
Figure 15:
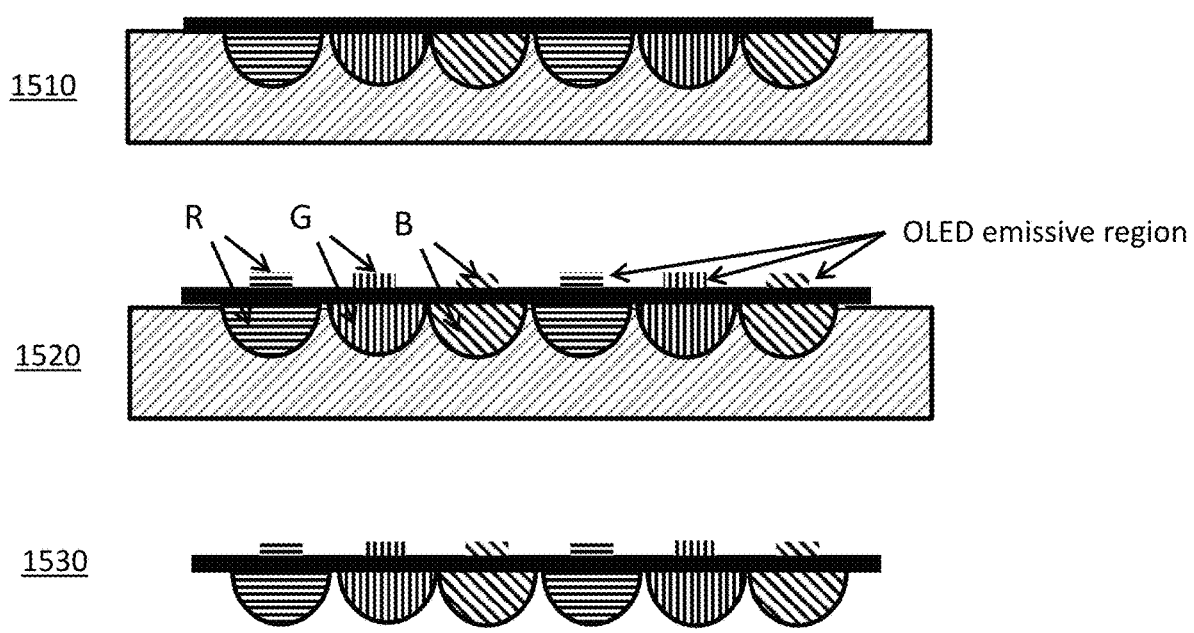
FIG. 15 shows an OLED fabricated on top of a microlens array (MLA) before release according to an embodiment of the invention.

At 1320, lens materials mixed with colored dyes may be ink jetted or otherwise deposited into the pre-determined mold locations. When the sizes of different color pixels are different, the corresponding wells also have different sizes. For example, a material mixed with red dye may be placed into the lens locations on the mold that are pre-designated for the red display pixel, as shown. This may be repeated as shown at 1330, 1340 until all colored lenses are made. Although shown for three total colors, more or fewer colored dyes and lenses may be used. The lens can be cured or partially cured to prevent mixing between different colors. A transparent base material may be coated or otherwise deposited on top of the colored lenses to integrate all lenses as shown at 1350. It may be preferred to use the same base material for outcoupling components such as lenses and the base film so they can mix well. One example is PMMA dissolved in solvent. To prevent the colored lens from being re-dissolved and mixed with other colors, the colored lens coating may not be required to fill each well on the mold entirely, as shown in FIG. 14, i.e., the structure in Figure FIG. 14 can replace the structure shown at 1340. After the based film is cured, the film can be released from the mold at 1360. Alternatively, the film may be released after the device and other layers are deposited on top the film, as shown in FIG. 15 and as described in further detail herein. The thickness of the base preferably should follow the requirement described in equations 3 and 4.

As another example, an MLA may be fabricated by ink-jetting lenses directly on top of each subpixel. This may be done after the display is made, and can be applied to both bottom emission and top emission OLEDs.

FIG. 15 shows an example of an OLED fabricated on an MLA prior to the MLA being released from the mold. 1510 shows an arrangement as previously described with respect to 1350. In an embodiment, OLED devices may be formed on top of the MLA base, as shown at 1520 in FIG. 15. The display subpixels may be formed on top of the microlens array with each color OLED sybpixel formed directly on top of the microlens of the same color. This process is similar to standard OLED display fabrication process. Alignment marks may be fabricated on the mold to make sure the correct alignment between the display subpixel and the colored lens. A barrier layer may be deposited on top of MLA base to prevent any outgassing. On top of the barrier, a TFT backplane may be fabricated, followed by OLED device fabrication. The OLED device may include two electrodes and one or more organic layers disposed between the electrodes, as previously described with respect to FIGS. 1 and 2. The pattern of the RGB pixels may be achieved using shadow masks. It may be preferred that another thin film passivation or barrier layer is applied on top of the OLED devices. Glass encapsulation can also be used. To facilitate the next process step, a film may be laminated on top of the device for protection and easy handling. At 1530, the MLA with OLED display subpixels disposed thereon may be separated from the mold. Additional layers may be added to the released device. Examples of such layers include AR coating, scratch resistant coating, hard coat, and the like. The hard coat may include one or more plastic films, barrier coated plastic films or thin glass.

In various embodiments as disclosed herein, outcoupling components may be attached to top or bottom emission devices. An example will now be described for attaching an MLA to a top emission OLED; a similar process may be used to attach an outcoupling component to a bottom emission OLED. For example, the MLA base may be attached to the bottom substrate of a bottom emission OLED.

A top emission OLED display may be fabricated or obtained separately. A thin film passivation or barrier layer may be deposited on top of the OLED display. A thin film layer may be preferred to minimize the distance t between the OLED and the MLA surface. As previously described, it may be preferred for this distance to be as small as possible.

A structure such as that shown at 1350 in FIG. 13 may be placed on top of a top emission OLED with the MLA facing away from the OLEDs. The alignment between the MLA and OLED device may be achieved, for example, by placing alignment marks on the display and MLA/mold to make sure the right subpixel is aligned with the right lens, i.e., the same color and position.

The MLA base may be attached to the OLED device, such as via a thin adhesive layer or a solvent coating. For example, if the MLA base material can be dissolved in a particular solvent, a thin coating of this solvent can be applied on the OLED top passivation layer followed by the attachment of the MLA. After the solvent is driven out of the system, the MLA may be automatically attached to the display.

As previously described with respect to the other examples, the mold may be removed after attaching the MLA to the OLED, point leaving the MLA attached to the OLED display. Additional functional layers may be added afterward as previously disclosed. The steps of placing the OLED on the MLA base and attaching the MLA base to the OLED may be performed with the MLA already released from the mold, as shown at 1360 in FIG. 13.

Figure 17:
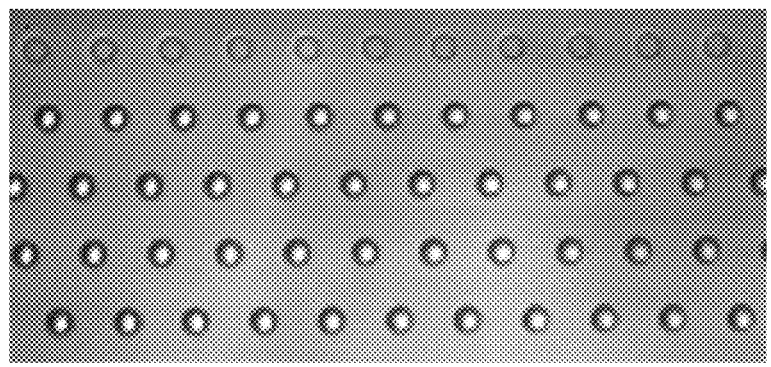
FIG. 17 shows a microscopic picture of pixels defined by circular well structures with microlenses ink-jetted on the pixels, with no microlens on the top row according to an embodiment of the invention.

In an embodiment, a colored outcoupling component such as a colored MLA also may be fabricated on displays by inkjet printing directly on the emitting surface of the OLED displays. The lens-to-pixel alignment may be achieved by using alignment features on the display during the ink-jet printing process. A general process includes mixing dye with lens material and depositing the solution via ink jet. After dispensing, it may be preferred to cure the solution to form the lens. The curing process may include baking, UV irradiation to drive the solvent out or cross-link the precursors, or the like. Other color agents such as quantum dots can be used. The size, shape and aspect ratio of the printed MLA can be tuned by the volume of the ink, the ink materials, the surface treatments and the topographic feature of on-print surface. The size of the microlens may be proportional to volume of the ink. By changing the ink materials and using different surface treatments, the contact angle and surface tension, and thus the shape and aspect ratio of the microlens, may be tuned. Furthermore, the surface topography of the on-print surface also affects the printing process and the properties of the microlens. In a bottom emission device, the on-print surface is flat. Therefore, the microlens properties are depending on the contact angle and surface tension. In a top emission device, due to the backplane process, the emitting surface without planarizing layer may be uneven. Usually, insulating grids are applied to separate each subpixel before OLED growth. In this case the subpixel active area is lower than the insulating grids, forming a well structure. When dispensing the ink materials, this well structure can affect the final shape of the microlens. A well-controlled process and delicately-selected ink material can form a well-defined microlens on each well as shown in FIG. 17. The first top row is empty pixels; the remaining rows are IJP MLA.

Figure 18:
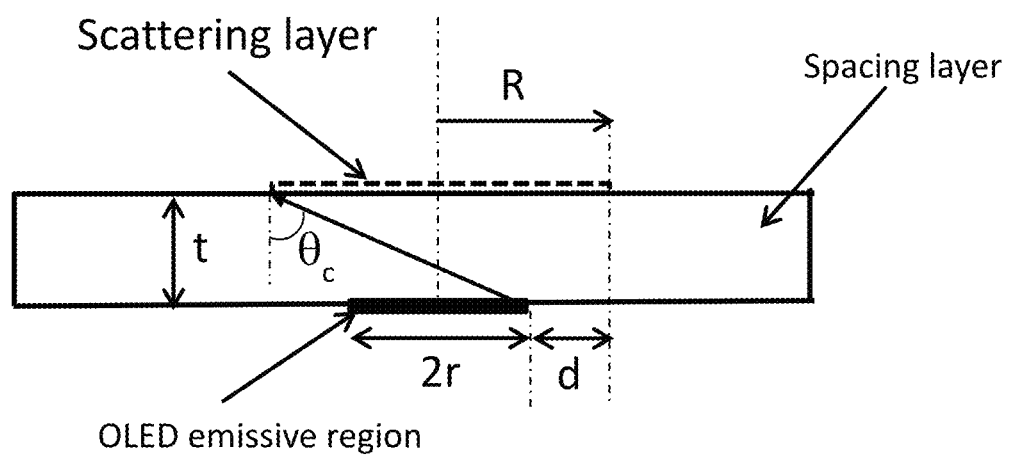
FIG. 18 shows a configuration that uses a scattering layer close to a display pixel for outcoupling according to an embodiment of the invention.

The previous examples use a microlens array as an illustrative outcoupling component to improve display efficiency. In some embodiments, a scattering layer instead of a microlens array may be used. For example, FIG. 18 shows a scattering layer that is applied directly on top of a display subpixel, i.e., in a stack with the emissive region or regions of the subpixel. When the spacing t is small and the scattering layer area is relatively large, the scattering layer may extract light that otherwise would be trapped in the substrate and organic layers due to waveguide effects. The same calculation disclosed previously herein can be used to design the scattering layer dimensions. Generally, a thinner t provides better extraction efficiency. In some embodiments, a spacing layer may be disposed between the emissive region and the scattering layer, as shown in FIG. 18. In which case, it may be desirable for the spacing layer to have a thickness t that follows a similar rule as previously disclosed with respect to the use of an outcoupling component:

$$0 < t < \sqrt{n_{lens}^2 - 1} * (r + R)$$

where $n_{sp}$ is the average refractive index of the spacing layer, and r and R are as previously defined and as shown in FIG. 18, but with respect to the scattering layer instead of an outcoupling component.

Figure 19:
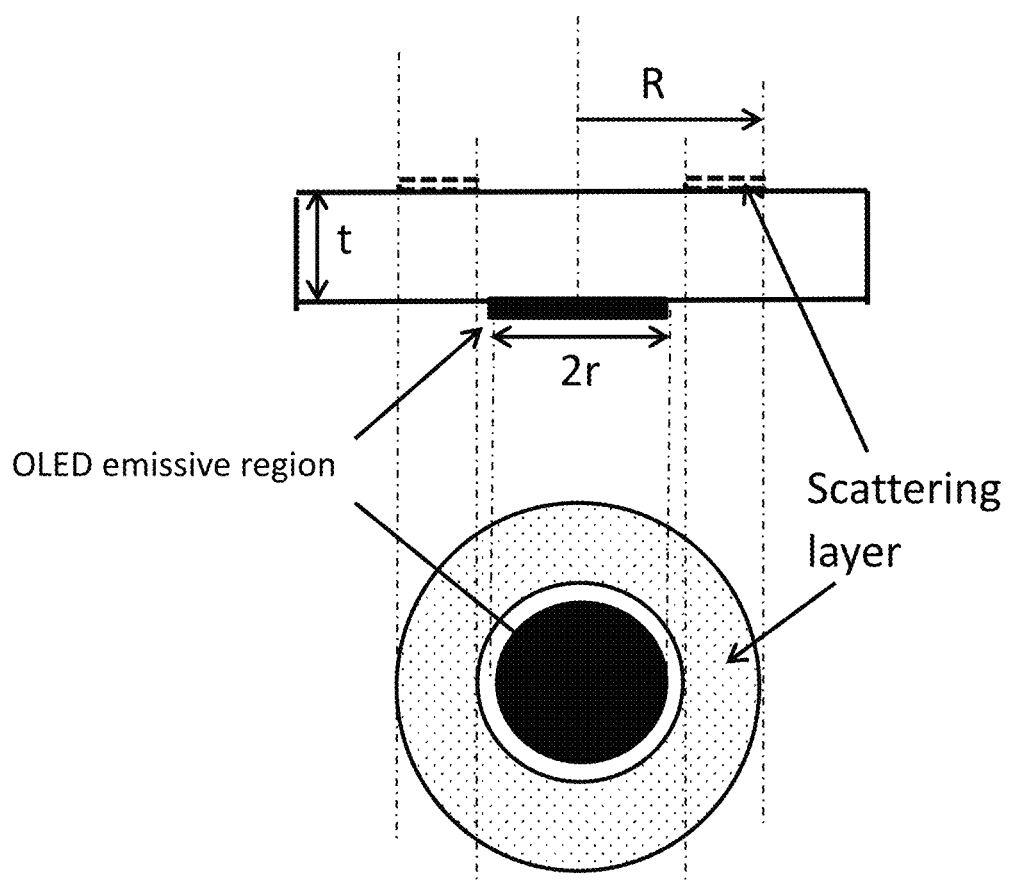
FIG. 19 shows a scattering layer having a ring pattern according to an embodiment of the invention.

In another embodiment, a scattering ring may be used instead of a circle for a circular OLED pixel, as shown in FIG. 19. In this configuration, the center region, which corresponds to the OLED pixel with comparable or larger areas, remains smooth. Most of the light reaching this center region from OLED has small incident angles so it can exit without the help of the scattering layer. In fact, in some embodiments it may be preferred for there to be no scattering in this region. The light reaching the scattering ring from the OLED typically has much larger incident angles and would be totally internal reflected without a scattering layer. When a scattering layer is used, this light may be redirected out of the substrate thus improving the efficiency of the device. A conventional circular polarizer for contrast improvement can still be used because there is no disruption by the scattering layer of the polarization in the active area of OLED pixel. To improve the impact on crosstalk and contrast performance, colored scattering material can be used. For example, a red scattering material can be used on top of a red subpixel, a blue scattering material with a blue subpixel, and so on.

A colored scattering material may be made, for example, by mixing scattering agents such as nanoparticles in the colored materials. A printing or coating process may be used to apply such a coating on top of the device. Surface treatments also may be used for precisely patterning the scattering layers. For example, a ring pattern can be treated with high surface energy using lithography process. When the scattering colored solution is applied, it is contained within the ring. Curing the material will solidify the material and permanently keep the material in the same place. Other methods also may be used to generate a scattering layer. For example, a scattering layer may be formed by roughening the surface in the desired area on top of display subpixel, instead of by depositing an additional layer or material.

Embodiments disclosed herein also may be combined with other outcoupling methods. For example, a corrugated structure with sub-micron pitch can extract plasmon mode light in the OLED. Such a device may be used in conjunction with the other structures disclosed herein to further improve the efficiency.

An outcoupling component as disclosed herein may be applied to any or all display subpixels. It also may be applied to only selective display subpixels depending on factors such as the pixel layout, the efficiency and lifetime of each color component, and the sensitivity of human eyes, or lenses of only one color could be applied to the display. As previously described, regardless of how many subpixels use an outcoupling component at a small distance t, there generally will be a tradeoff between efficiency and contrast/resolution. With the improved efficiency provided by outcoupling structures, there may be decrease in contrast and pixel definition (due to cross talk). In some configurations, it may be preferred to only apply outcoupling features to selected pixels, colors, or subpixels. For example, outcoupling structures may be applied only to the blue subpixels in a display. Because the human eye generally is less sensitive to the resolution of blue light, relative to red, green and especially yellow light, the decrease in resolution due to optical cross-talk is less noticeable or not an issue. At the same time, blue emission devices often benefit the most from an improvement in light output and lifetime. The use of outcoupling features as disclosed herein typically will increase the lifetime and/or light output of each subpixel to which they are applied, which may make these techniques particularly suited for use with blue subpixels.

In an embodiment, blue colored outcoupling components, such as microlenses, may be used throughout a display, i.e., with some or all of the subpixels in a display. In such a configuration blue colored lenses may be applied continuously across the display, but would only enhance the output from blue sub-pixels. This would have the benefit of only requiring the deposition of one type of microlens or other outcoupling component across the display without the need for patterning different colored lenses. The blue colored lenses may or may not be physically placed over other colored subpixels but would have no impact on cross-talk, although they may reduce the output of non-blue sub-pixels. In some embodiments, it may be preferred for blue colored outcoupling components to be placed or patterned only over blue emitting sub-pixels. Another example of applying outcoupling components only to selective pixels is in a configuration where the subpixel arrangement and/or dimensions prevent the application of outcoupling components to all individual subpixels, such as where certain subpixels are too small or too close for outcoupling components to be applied.

In some cases, it may be preferred for multiple pixels or subpixels to share the same outcoupling features as previously described. One example is when the subpixels are too small for precision placement of the outcoupling features. Multiple subpixels can then share the same outcoupling feature. For example, a micro-lens covering or a scattering ring surrounding multiple subpixels.

As used herein, an "outcoupling component" refers to a component that outcouples light from an OLED. To perform outcoupling, a component must, when optically coupled to an emissive region of an OLED either directly indirectly, result in more light exiting the OLED than otherwise would exit the OLED in the absence of the outcoupling component. Examples of outcoupling components include microlens arrays of any size, shape, and arrangement.

As used herein, a "red" layer, material, region, or device refers to one that emits light in the range of about 580-700 nm; a "green" layer, material, region, or device refers to one that has an emission spectrum with a peak wavelength in the range of about 500-600 nm; a "blue" layer, material, or device refers to one that has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy. Two components, such as two emissive regions, layers, materials, or devices are considered to have the "same color" if they emit light having a peak wavelength within the same range as disclosed herein. For example, two emissive regions may both be described as "red" and thus described as having the "same color" if both regions emit light having a peak wavelength in the range of about 580-700 nm.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating an organic light emitting display, the method comprising:
    obtaining a plurality of OLEDs;
    fabricating an outcoupling component array; and
    optically coupling the outcoupling component array to the plurality of OLEDs;
    wherein, for each OLED of the plurality of OLEDs and at least one outcoupling component of the outcoupling component array that is disposed in a stack with, and optically coupled to, the each OLED, $0 < t < \sqrt{n_{lens}^2 - 1} * (r+R)$;
    wherein an emissive region has a width across a substrate of 2r, the outcoupling component is disposed over the emissive region and has a horizontal base surface, wherein the base surface is disposed a vertical distance t from the emissive region and is optically coupled to the emissive region, and the outcoupling component has an index of refraction $n_{lens}$ and a width across the base surface of 2R, wherein a spacing layer is disposed between the emissive region and the outcoupling component, and is laterally extended beyond the outcoupling component, wherein the spacing layer includes a material having an index of refraction between 0.98 $n_{lens}$ and 1.02 $n_{lens}$.

2. The method of claim 1, further comprising attaching the outcoupling component array to the plurality of OLEDs.

3. The method of claim 1, wherein the fabricating the outcoupling component array comprises fabricating the outcoupling component over the plurality of OLEDs.

4. The method of claim 3, wherein fabricating the outcoupling component array comprises depositing the outcoupling component array via an ink-jet technique.

5. The method of claim 1, wherein t is not greater than 80 µm, not greater than 27 µm, or not greater than 15 µm.

6. The method of claim 1, further comprising:
    disposing a light absorption material on an edge of the outcoupling component that is closest to the emissive layer.

7. The method of claim 1, further comprising:
    disposing a defocusing layer disposed between the outcoupling component and the emissive layer, wherein the defocusing layer has an index of refraction $n_{def}$ that is less than $n_{lens}$.

8. The method of claim 1, further comprising:
    disposing a circular polarizer disposed between the outcoupling component and the emissive layer.

9. The method of claim 1, wherein the outcoupling component is fabricated to have maximum thickness that is at least 10% greater than r.

10. The method of claim 1, wherein the outcoupling component is fabricated to have a decreasing cross-sectional area along a line normal to the emissive layer and in a direction moving away from the emissive layer.

* * * * *